United States Patent
Zhang et al.

(10) Patent No.: US 10,222,422 B2
(45) Date of Patent: Mar. 5, 2019

(54) SHORT-CIRCUIT DETECTION CIRCUITS, SYSTEM, AND METHOD

(71) Applicant: Avago Technologies International Sales Pte. Limited, Singapore (SG)

(72) Inventors: Bin Zhang, Singapore (SG); Mei Zhen Choo, Singapore (SG)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 1113 days.

(21) Appl. No.: 14/528,888

(22) Filed: Oct. 30, 2014

(65) Prior Publication Data
US 2016/0124037 A1    May 5, 2016

(51) Int. Cl.
*G01R 31/327* (2006.01)
*G01R 31/26* (2014.01)

(52) U.S. Cl.
CPC ...... *G01R 31/3275* (2013.01); *G01R 31/2608* (2013.01)

(58) Field of Classification Search
CPC  H02H 3/08; H02H 3/087; H02H 9/02; H02H 3/10
USPC ........................................ 361/93.1
See application file for complete search history.

(56) References Cited

U.S. PATENT DOCUMENTS

| | | |
|---|---|---|
| 5,444,591 A | 8/1995 | Chokhawala et al. |
| 7,408,755 B1 | 8/2008 | Ye et al. |
| 7,463,079 B2 | 12/2008 | De et al. |
| 2004/0027762 A1 | 2/2004 | Ohi et al. |
| 2007/0252565 A1 | 11/2007 | Wang et al. |
| 2008/0304197 A1 | 12/2008 | Higashi |
| 2012/0206174 A1 | 8/2012 | Maruyama et al. |
| 2012/0218669 A1 | 8/2012 | Wu et al. |
| 2014/0192449 A1 | 7/2014 | Shimizu |
| 2014/0218833 A1 | 8/2014 | Wu et al. |
| 2015/0340355 A1* | 11/2015 | Zhang ................. G01R 19/00 361/86 |
| 2016/0028219 A1* | 1/2016 | Habu ................... H03F 1/52 361/101 |

FOREIGN PATENT DOCUMENTS

CN    203481816    3/2014

OTHER PUBLICATIONS

Cho et al. "Design of Integrated IGBT Gate Drive with SOA Consideration," Eresnews, Feb. 2000, vol. 15, No. 1, 2 pages [retrieved from: http://www.eng.nus.edu.sg/EResnews/0002/rh/rh_pg_12/rh-ee1.htm].

Dybko "Fiber optic chemical sensors," Chemical Sensors Research Group, 2005, 9 pages [retrieved from: http://csrg.ch.pw.edu.pl/tutorials/fiber/].

(Continued)

*Primary Examiner* — Dharti H Patel
(74) *Attorney, Agent, or Firm* — Sheridan Ross P.C.

(57) ABSTRACT

Systems, circuits, and methods for detecting short circuit events during operation of an Insulated-Gate Bipolar Transistor (IGBT) from are provided. A short-circuit detection circuit is described is capable of creating an adaptive blanking time during which a short-circuit detector is blind to short-circuit events for the IGBT and after which the short-circuit detector is allowed to monitor and detect the short-circuit events for the IGBT.

20 Claims, 10 Drawing Sheets

(56) References Cited

OTHER PUBLICATIONS

Semikron "Connection of Gate Drivers to IGBT and Controller," PowerGuru, Jul. 24, 2012, 6 pages [retrieved from: http://www.powerguru.org/connection-of-gate-drivers-to-igbt-and-controller/].
Dulau et al., "A New Gate Driver Integrated Circuit for IGBT Devices with Advanced Protections", IEEE Transactions on Power Electronics, vol. 21, No. 1, Jan. 2006, 7 pages.

\* cited by examiner

SHORT-CIRCUIT DETECTION CIRCUITS, SYSTEM, AND METHOD

FIELD OF THE DISCLOSURE

The present disclosure is generally directed toward IGBT driver circuits and short-circuit detection circuits.

BACKGROUND

The Insulated-Gate Bipolar Transistor (IGBT) is a three-terminal power semiconductor device primarily used as an electronic switch and in newer devices is noted for combining high efficiency and fast switching. It switches electric power in many modern appliances such as: Variable-Frequency Drives (VFDs), electric cars, trains, variable speed refrigerators, lamp ballasts, air-conditioners, and even stereo systems with switching amplifiers.

IGBTs are often used for high voltage (e.g., greater than 600V) and high-current power converter applications. In these types of applications, a short-circuit of the load wire to a power source will result in a large current flowing through the IGBT, which is likely to damage the IGBT. Because of the potential for damage to IGBTs, gate drive circuits must detect IGBT short-circuit conditions and turn off the IGBT safely to prevent damage to the IGBT.

Depending upon the types of IGBTs employed in a system, there are two common approaches to detect short-circuit events for IGBTs: (1) detection of the IGBT's collector-to-emitter desaturation voltage and (2) detection of a fraction of the IGBT's emitter current. Detecting the collector-to-emitter desaturation voltage is useful when access to the IGBT collector node is available. On the other hand, emitter current sensing is useful for current sense IGBTs where there is an additional sense node split out from the emitter node of the IGBT.

Figure 1:
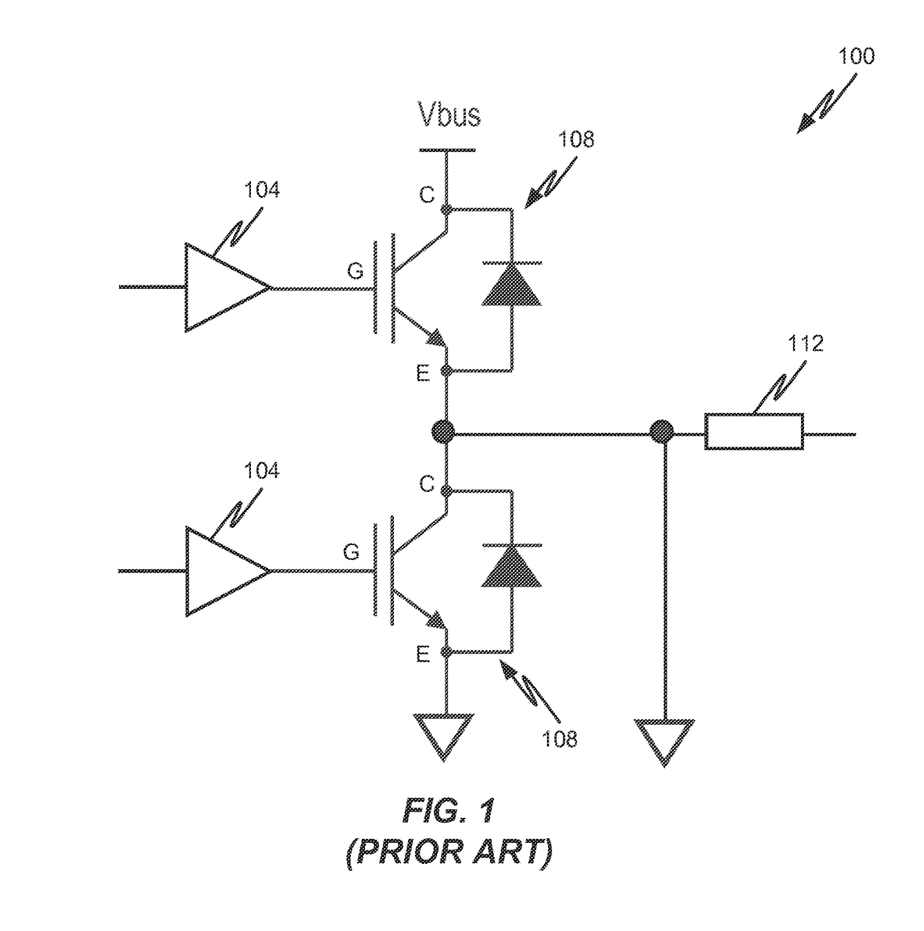
FIG. 1 is a circuit diagram depicting a first prior art circuit.

A common IGBT drive circuit 100 without short-circuit protection is shown in FIG. 1 where a load 112 is driven by current from IGBTs 108, which are in turn driven by gate drivers 104. The depicted circuit 100 is often referred to as a half-bridge circuit and is among the most important circuit configurations for power drives. The circuit 100 is shown to include two IGBTs 108 connected to one another at the circuit's 100 midpoint and the load 112 is connected to this midpoint. The midpoint corresponds to a circuit node where an emitter E of one IGBT 108 is connected to a collector C of another IGBT 108.

Problematically, as shown in FIG. 1, if the circuit 100 experiences a short (e.g., between Ground/common voltage and the circuit's 100 midpoint) then excessive current will flow through the top IGBT 108, most likely resulting in damage to the IGBT 108.

Figure 2A:
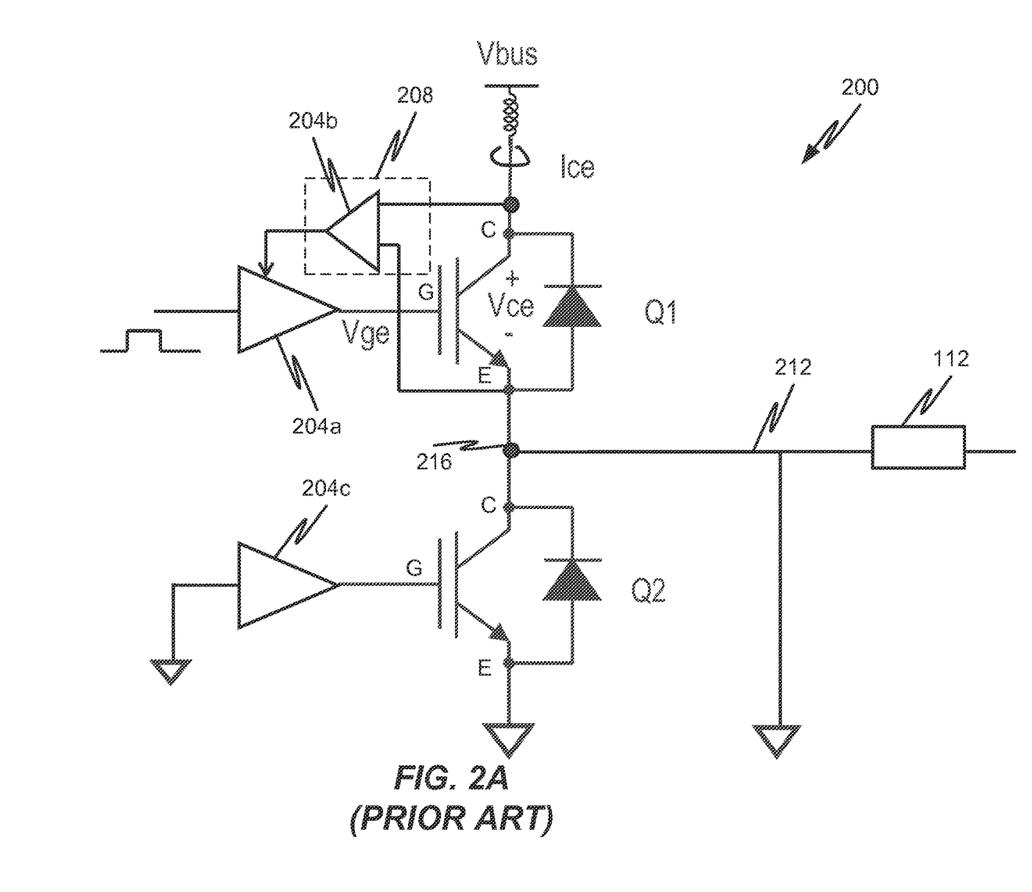
FIG. 2A is a circuit diagram depicting a second prior art circuit.

FIG. 2A depicts an illustrative circuit 200 that includes a short-circuit detection circuit 208 that enables the detection of a short-circuit event that could potentially damage the first IGBT Q1 in the circuit 200. The circuit 200 facilitates the detection of collector-to-emitter desaturation voltage of the first IGBT Q1. It should be appreciated that the first IGBT Q1 may correspond to the same or similar component as the IGBT 108 depicted in FIG. 1. Similarly, the second IGBT Q2 depicted in circuit 200 may correspond to the same or similar component as the IGBT 108 depicted in FIG. 1.

As in FIG. 1, the circuit 200 is configured in a half-bridge configuration where a first driver 204a is driving the first IGBT Q1 and a second driver 204c is driving the second IGBT Q2. The short-circuit detection circuit 208 is shown to include a second driver 204b that senses the collector-to-emitter voltage Vce for the first IGBT Q1. An output of the second driver 204b provides information back to the first driver 204a such that if the short-circuit detection circuit 208 detects a short-circuit event, the first driver 204a is turned off. Most often, the short-circuit event that is detected by the short-circuit detection circuit 208 corresponds to a short between the midpoint 216 of the half-bridge circuit and ground. When such a condition is detected, the second driver 204b provides a signal to the first driver 204a that causes the first driver 204a to turn off. The second driver 204a is turned off in an effort to protect the first IGBT Q1 from overheating and/or damage due to increased current flowing from the collector C to the emitter E (known as collector-to-emitter current Ice).

During short-circuit protection test in circuit 200 for a short-circuit event, the third driver 204c is kept inactive, thereby keeping the bottom side of the second IGBT Q2 off. It should be appreciated that while circuit 200 is shown as including two IGBTs Q1, Q2, a circuit with a greater or lesser number of IGBTs may benefit from short-circuit detection and protection techniques.

During turn on of the IGBT Q1, the gate-to-emitter voltage rises from zero or negative supply and enters the Miller Plateau level. The Miller Plateau is caused by Miller Current flowing through the IGBT, which can be represented as $dV_{CE}/dt * C_{GC}$. During the Miller Plateau region, the collector-to-emitter voltage of the IGBT is larger than the desaturation voltage threshold, therefore the IGBT short-circuit detection circuit 208 has to be blanked from this region in order to avoid false triggers (i.e., false positive detection of a short-circuit event resulting in an unnecessary shut-down of the IGBT).

Figure 2B:
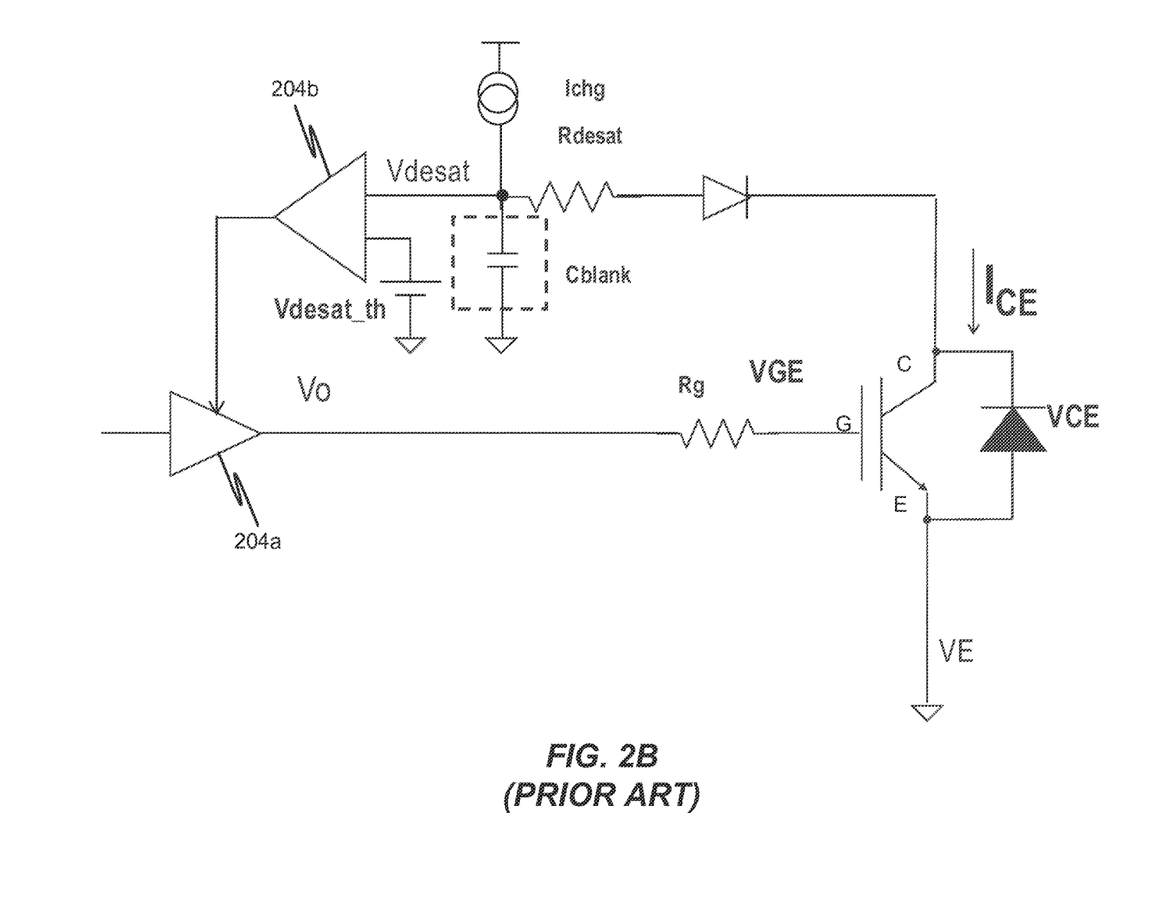
FIG. 2B is a circuit diagram depicting a third prior art circuit implementing blanking time for collector to emitter voltage desaturation detection.

Known blanking circuits used for the circuit 200 utilize a capacitor, Cblank, shown in FIG. 2B to create a fixed blanking time. A problem with the known blanking solutions is that the fixed blanking time have to be relatively large based on the worst case scenario of the Miller Plateau to avoid the false positive detection of a short-circuit event. In addition practical tolerance of circuit parameters, e.g. charging current Ichg, capacitor tolerance due to Cblank and voltage threshold tolerance due to Vdesat_th have to be accommodated by designed minimum blanking time, which results in over-design of total blanking time. Ultimately, most durations of the Miller Plateau are not as long as the worst case scenario. Thus, the fixed amount of blanking time causes slow responses to short-circuit events, which could ultimately result in high short circuit current and shorten life expectation of IGBT.

Figure 3A:
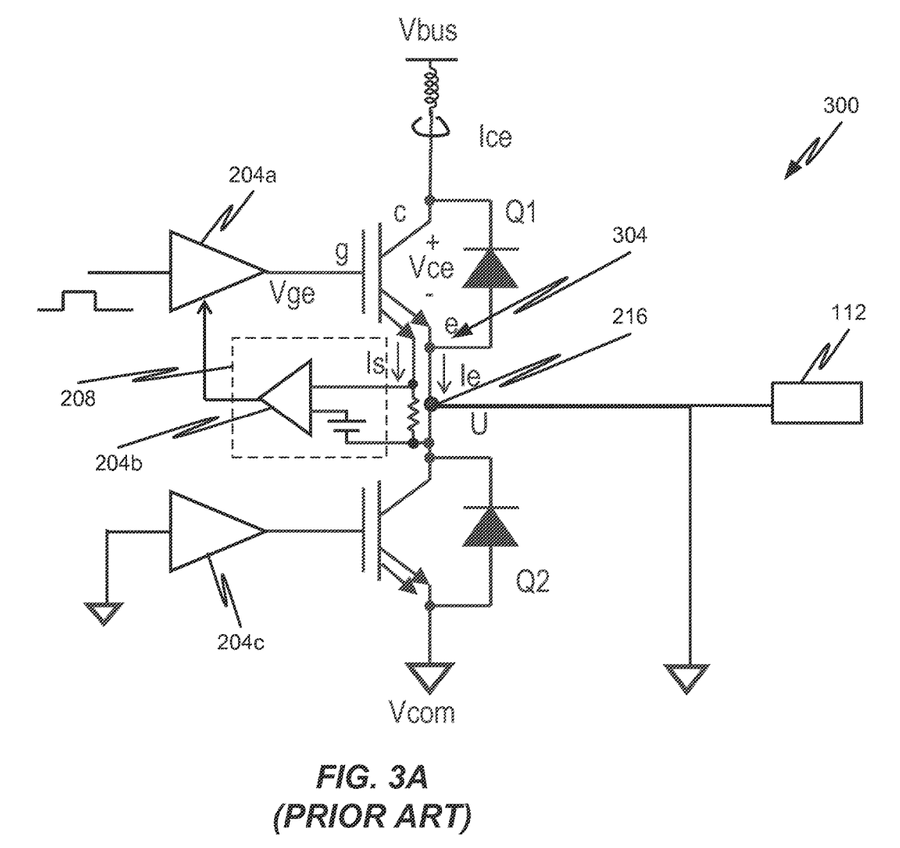
FIG. 3A is a circuit diagram depicting a fourth prior art circuit.

FIG. 3A depicts another illustrative circuit 300 that includes a short-circuit detection circuit 208 that enables the detection of a short-circuit event that could potentially damage the first IGBT Q1 in the circuit 300. The circuit 300 differs from circuit 200 in that circuit 300 is configured to monitor sense current Is flowing through the emitter of the first IGBT Q1. Specifically, circuit 300 utilizes a short-circuit detection circuit 208 to measure current Is flowing from the emitter 304 of the first IGBT Q1. The emitter 304 of the first IGBT Q1 is different from the emitter of the first emitter in circuit 200 in that the emitter 304 of the first IGBT Q1 is a split emitter that emits an emitter current Ie and a sense current Is. The sense current Is is a fractional value of the emitter current Ie. The short circuit detection circuit 208 comprises a resistor that creates a voltage that can be measured by the second driver 204b and compared with a threshold voltage value. If the measured voltage exceeds the threshold voltage value, then the second driver 204b determines that a short-circuit event is occurring and turns off the first driver 204a, thereby turning off the first IGBT Q1.

Figure 3B:
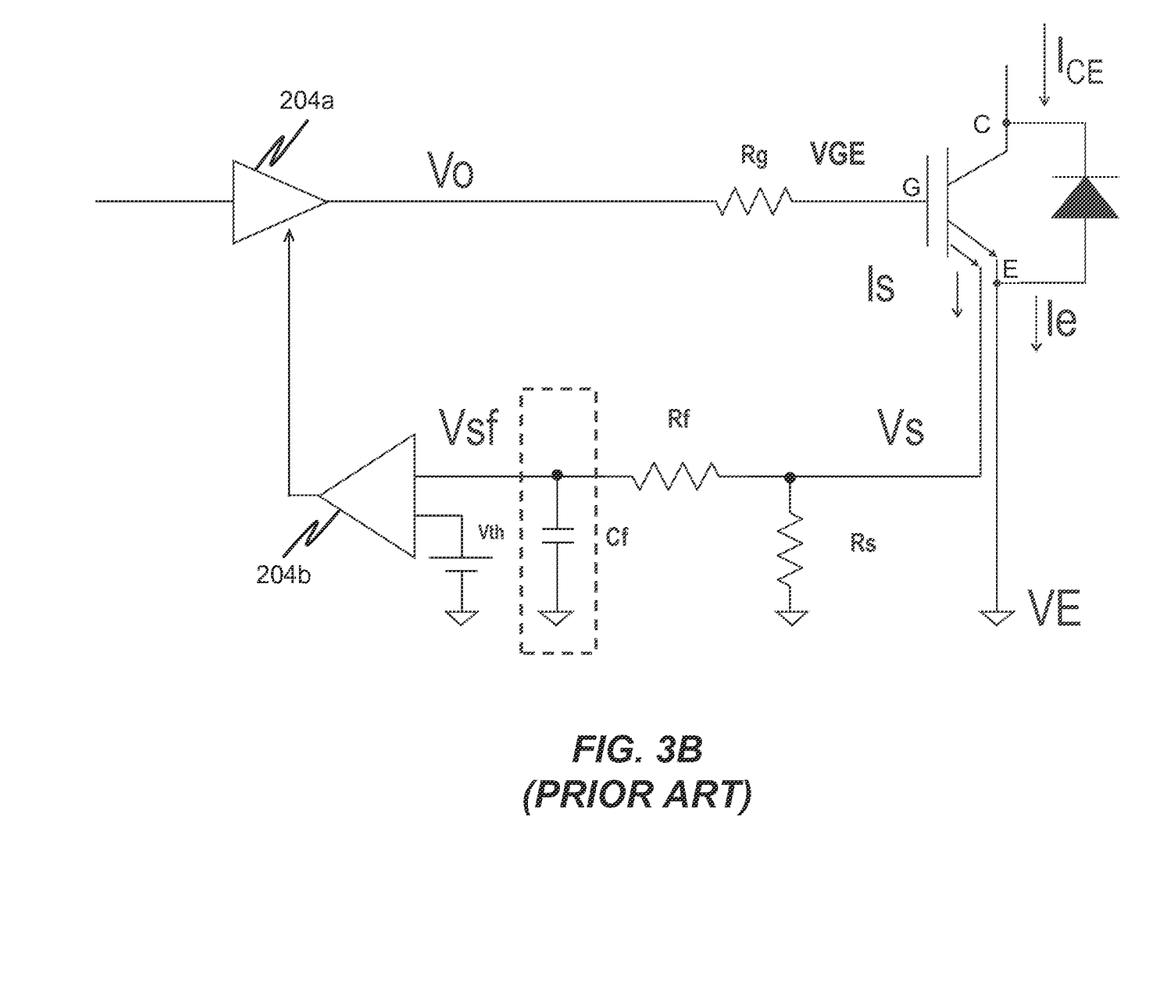
FIG. 3B is a circuit diagram depicting a fifth prior art circuit implementing over voltage filter for sense current measurement of emitter sense type of IGBT.

A problem in emitter sense detection is that due to high collector to emitter voltage during Miller plateau, there are spikes or blips of finite duration that appear on the sense voltage (Vs) These over voltage on Vs may cause the false triggering (i.e., false positive detection of a short-circuit event). Blanking solutions have also been deployed for the emitter sense detection circuit 300. Much like blanking solutions for circuit 200, the currently-available blanking solutions for circuit 300 utilize an RC filter, e.g. Rf and Cf as shown in FIG. 3B, to create a fixed filter time constant. Again, the resistance and capacitance of the filter are relatively large and designed for the worst case scenario. The over design of the filter circuit to accommodate over voltage on Vs during Miller plateau can cause slow response time, which limit the utility of short-circuit detection circuits.

BRIEF DESCRIPTION OF THE DRAWINGS

The present disclosure is described in conjunction with the appended figures, which are not necessarily drawn to scale.

DETAILED DESCRIPTION

It is with respect to the above-noted challenges that embodiments of the present disclosure were contemplated. In particular, a system, circuits, and method of operating such circuits are provided that solve the drawbacks associated short-circuit protection circuits of the prior art.

While embodiments of the present disclosure will primarily be described in connection with short-circuit protection circuits for IGBTs or circuits containing IGBTs, it should be appreciated that embodiments of the present disclosure are not so limited.

Various aspects of the present disclosure will be described herein with reference to drawings that are schematic illustrations of idealized configurations. It should be appreciated that while particular circuit configurations and circuit elements are described herein, embodiments of the present disclosure are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of the present disclosure.

It should also be appreciated that the embodiments described herein may be implemented in any number of form factors. Specifically, the entirety of the circuits disclosed herein may be implemented in silicon as a fully-integrated solution (e.g., as a single Integrated Circuit (IC) chip or multiple IC chips) or they may be implemented as discrete components connected to a Printed Circuit Board (PCB).

Figure 4:
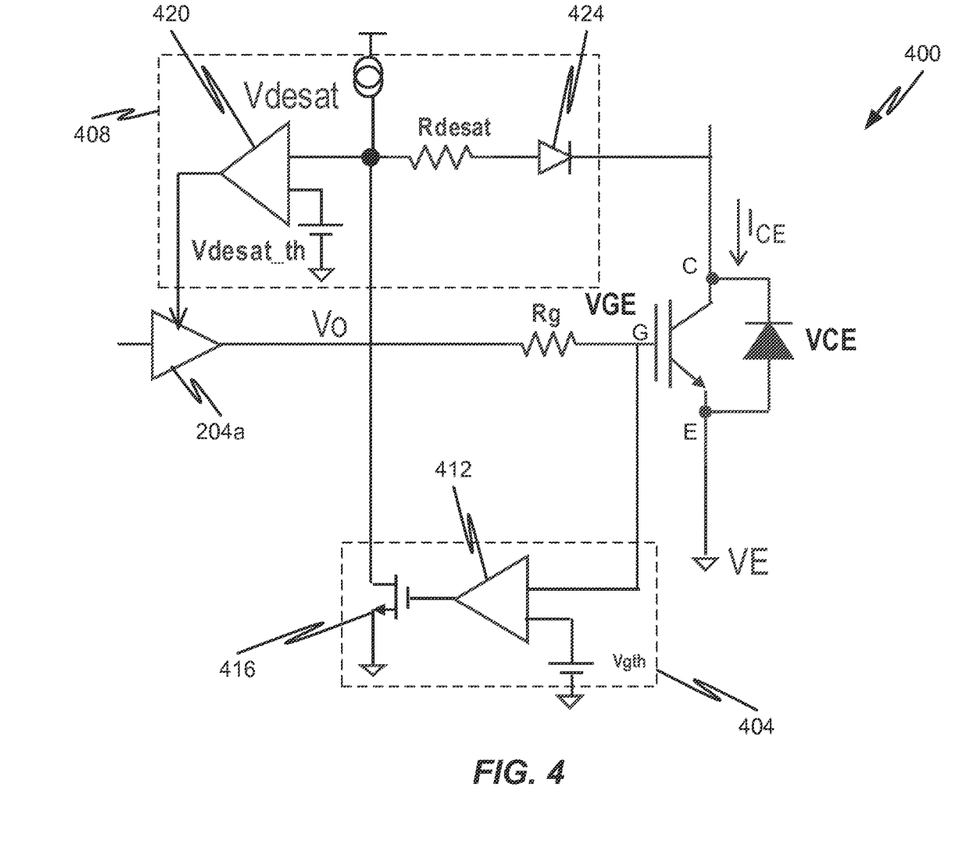
FIG. 4 is a circuit diagram depicting a first short-circuit detection circuit in accordance with at least some embodiments of the present disclosure.
Figure 5:
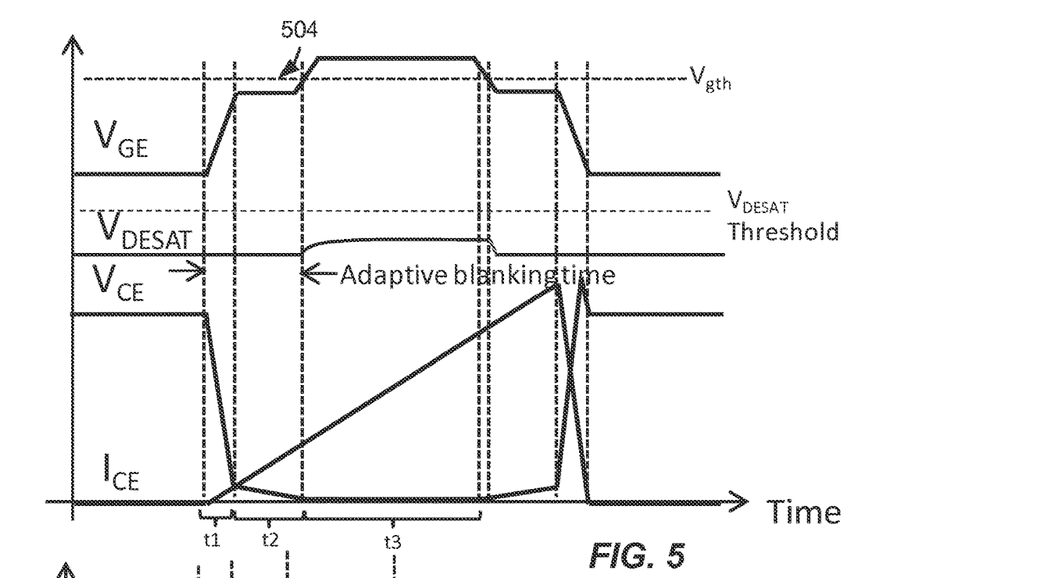
FIG. 5 is a timing diagram depicting current and voltage waveforms produced in the circuit of FIG. 4 during normal switching.
Figure 6:
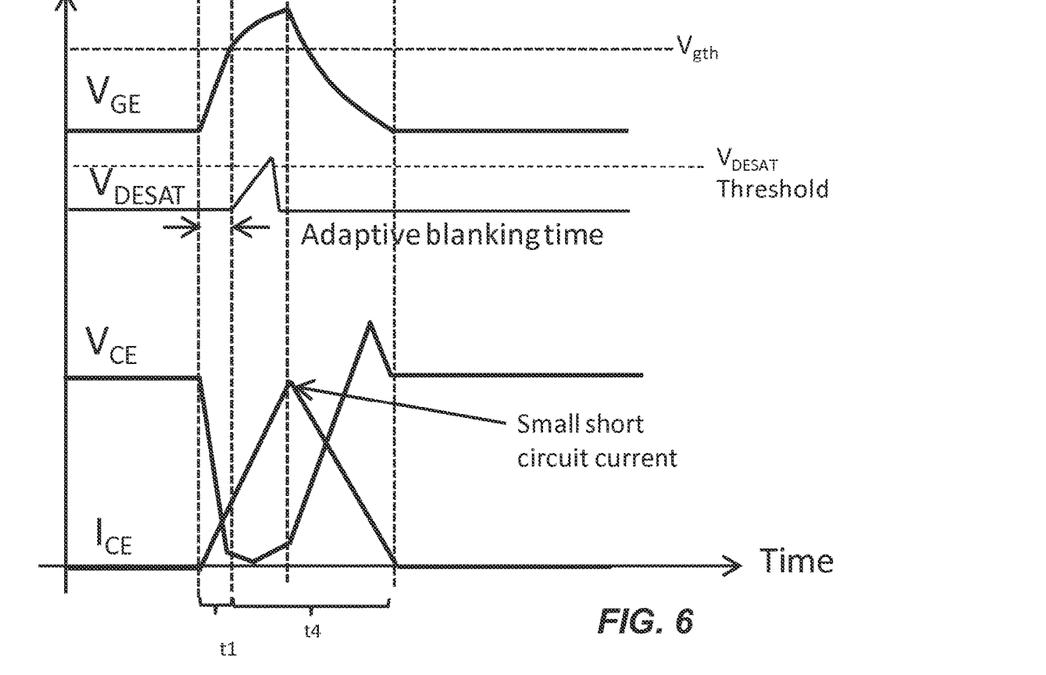
FIG. 6 is a timing diagram depicting current and voltage waveforms produced in the circuit of FIG. 4 during a short-circuit event.

With reference now to FIGS. 4-6, an illustrative circuit 400 will be described in accordance with at least some embodiments of the present disclosure. The circuit 400 is shown to include one or more IGBTs having a collector, gate, and emitter. A first driver 204a is used to provide a driving current to the gate of the IGBT Q1. As can be appreciated, the emitter of the first IGBT Q1 may be connected to a collector of a second IGBT, such that the circuit 400 has a half-bridge configuration. In fact, the circuit 400 only depicts a single IGBT Q1, but embodiments of the present disclosure may utilize a circuit 400 with one or many IGBTs.

The circuit 400 also possesses an adaptive blanking circuit 404 and a short-circuit detector 408. The blanking circuit 404 receives, as input, a signal from the gate of the first IGBT Q1 and provides an output to the short-circuit detector 408. In some embodiments, the adaptive blanking circuit 404 is configured to dynamically create an adaptive blanking time that directly corresponds to an amount of time for the IGBT Q1 to switch from off to on and then pass through its Miller Plateau. After the IGBT Q1 has passed through its Miller Plateau, the adaptive blanking circuit 404 provides a signal to the short-circuit detector 408 that enables the short-circuit detector 408 to begin monitoring the IGBT Q1 and, more broadly the circuit 400, for short-circuit events. Until the short-circuit detector 408 receives the appropriate input from the adaptive blanking circuit 404, the short-circuit detector 408 is blind to the occurrence of short-circuit events.

Advantageously, the adaptive blanking circuit 404 may be configured to create a different duration of a blanking period for each on/off cycle of the IGBT Q1. In other words, the blanking period created by the adaptive blanking circuit 404 is neither static nor based on a worst case scenario design for the IGBT Q1. Instead, the adaptive blanking circuit 404 can monitor the actual state of the IGBT Q1 and determine when the IGBT Q1 has passed through the Miller Plateau—at which point the short-circuit detector 408 can be activated. By delaying activation of the short-circuit detector 408, the adaptive blanking circuit 404 helps prevent the false detection of a short-circuit event, which would unnecessarily result in the first driver 204a being turned off.

In accordance with at least some embodiments, the adaptive blanking circuit 404 comprises an active comparator 412 and a switch 416. The active comparator 412 may correspond to an operational amplifier or a similar comparator circuit element. The active comparator 412 is configured to compare the gate-to-emitter voltage of the IGBT Q1 with a gate threshold voltage Vgth. When the gate-to-emitter voltage of the IGBT Q1 meets or exceeds the gate threshold voltage Vgth, the active comparator 412 provides a signal to the switch 416 instructing the switch 416 to change from a first state to a second state. In some embodiments, the gate threshold voltage Vgth is set to a value corresponding to slightly higher than the Miller Plateau level of the IGBT Q1. Thus, the gate-to-emitter voltage of the IGBT Q1 does not rise above the gate threshold voltage Vgth until the IGBT Q1 has moved beyond the Miller Plateau. As can be seen in FIG. 5, during normal switching operations, the Miller Plateau 504 is not exceeded until after time t1 (IGBT turn-on time) and time t2 (Miller Plateau duration). Thus, the adaptive blanking time created by the adaptive blanking circuit 404 corresponds to an actual amount of time required for the IGBT Q1 to turn on and move through the Miller Plateau 504. In some embodiments, the adaptive blanking period may vary for the IGBT Q1 from cycle-to-cycle.

Advantageously, if the IGBT Q1 is operating normally and no short-circuit events occur for the circuit 400, the IGBT Q1 is on for an amount of time t3 and then switched off. Thanks to the adaptive blanking time, the possibility of false detection of short-circuit events is minimized. As shown in FIG. 6, however, if a short-circuit event does occur, the short-circuit detector 408 is enabled to quickly detect such an event immediately after the adaptive blanking period (e.g., t1). In particular, once the gate voltage of IGBT Q1 has reached Vgth, the short-circuit detector 408 is enabled to become active during a detection time t4. If a short-circuit event is occurring, the short-circuit detector 408 is enabled to detect such an occurrence without an unnecessary delay traditionally imposed by static blanking periods (which have been known to last longer than the actual duration of the Miller Plateau) 504.

Referring back to the structure of the adaptive blanking circuit 404, when the active comparator 412 determines that the gate-to-emitter voltage of the IGBT Q1 has met or exceeded the gate threshold voltage Vgth, the active comparator 412 provides a signal to the switch 416, which causes the switch 416 to activate the short-circuit detector 408. In some embodiments, the switch 416 corresponds to an NMOS transistor, but it should be appreciated that a NPN transistor, PNP transistor, or any other type of electrical component capable of performing electrical switching functions can be used for the switch 416. The switch 416 is shown to have a first terminal attached to an output of the active comparator 412, a second terminal attached to ground, and a third terminal attached to the input of the short-circuit detector 408. When the switch 416 changes from one state to another state (e.g., from on to off or vice versa), the short-circuit detector 408 is configured to begin monitoring the IGBT Q1 and the circuit 400 in general for short-circuit events. Prior to being activated (e.g., during the adaptive blanking time), the short-circuit detector 408 is blind to short-circuit events and is not monitoring the IGBT Q1.

The illustrative example of the short-circuit detector 408 is configured to measure the desaturation voltage of the IGBT Q1 to determine if a short-circuit event is occurring. Specifically, the short-circuit detector 408 comprises one input connected to the collector of the IGBT Q1, thereby enabling the short-circuit detector 408 to measure the collector-to-emitter voltage (also referred to as collector-to-emitter desaturation voltage) and compare the measured voltage with a desaturation threshold voltage Vdesat_th. The short-circuit detector 408 employs a diode 424, desaturation resistor Rdesat, and second driver 420 for comparing the desaturation voltage of the IGBT Q1 with the desaturation threshold voltage Vdesat_th after the short-circuit detector 408 has been activated by the adaptive blanking circuit 404. If the desaturation voltage does not exceed the desaturation threshold voltage Vdesat_th, then the IGBT Q1 continues with normal switching operations. On the other hand, as shown in FIG. 6, if the desaturation voltage measured by the second driver 420 meets or exceeds the desaturation threshold voltage Vdesat_th, then the second driver 420 will determine that a short-circuit event is occurring and, in response thereto, will shut down the first driver 204a, thereby minimizing the amount of excess current provided to the IGBT Q1 and hopefully preventing damage to the IGBT Q1. This helps to minimize the amount of short-circuit current $I_{CE}$ from flowing through the IGBT Q1.

Figure 7:
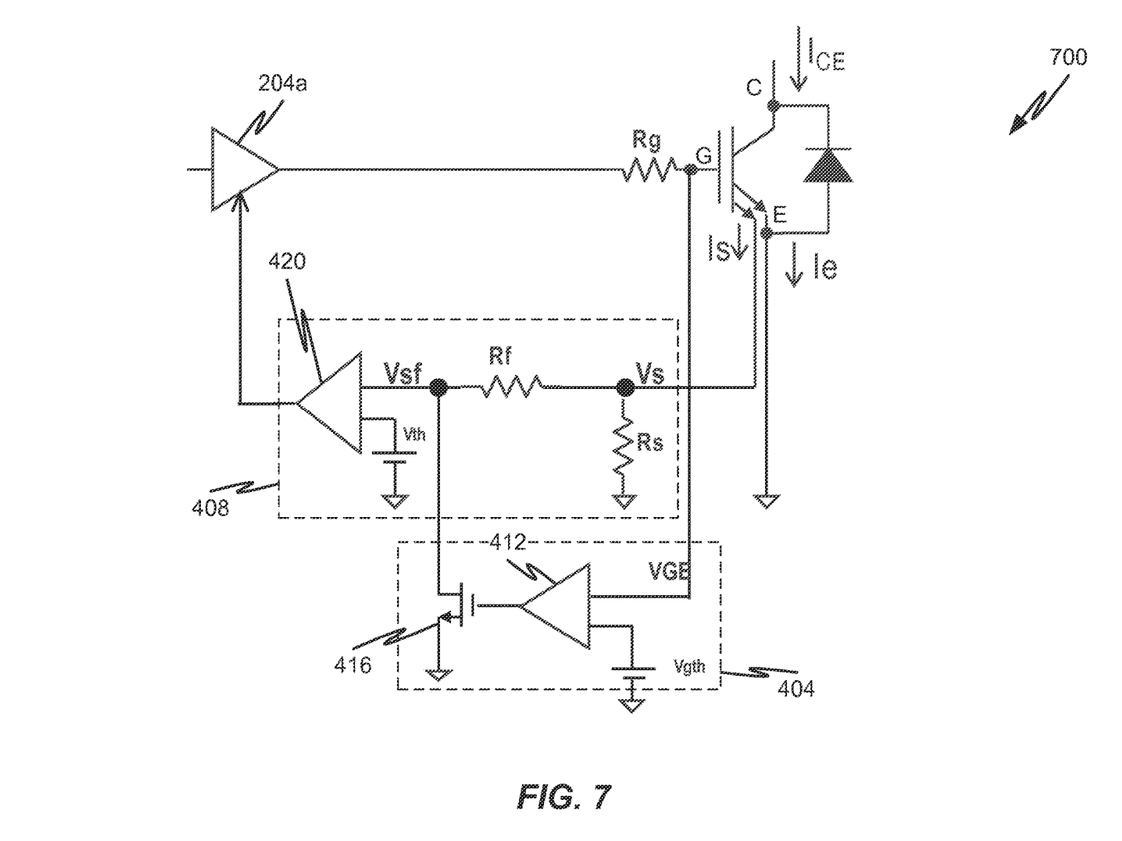
FIG. 7 is a circuit diagram depicting a second short-circuit detection circuit in accordance with at least some embodiments of the present disclosure.
Figure 8:
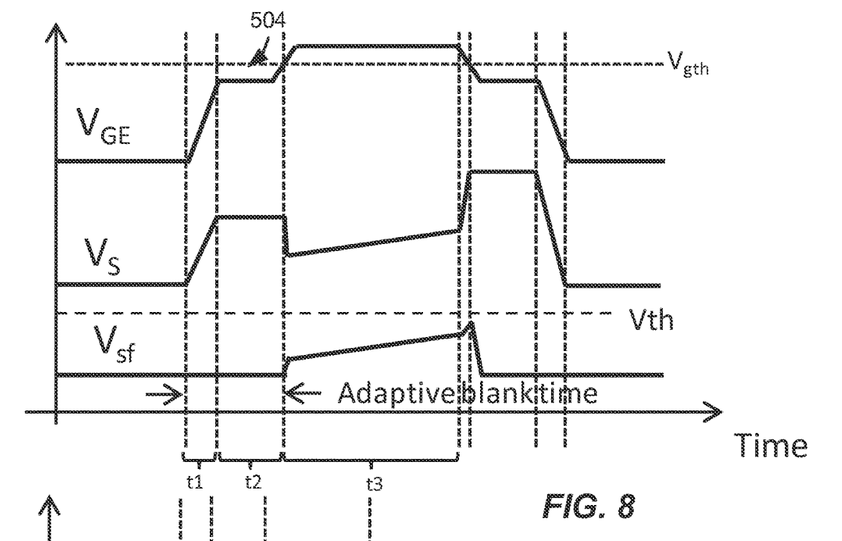
FIG. 8 is a timing diagram depicting current and voltage waveforms produced in the circuit of FIG. 7 during normal switching.
Figure 9:
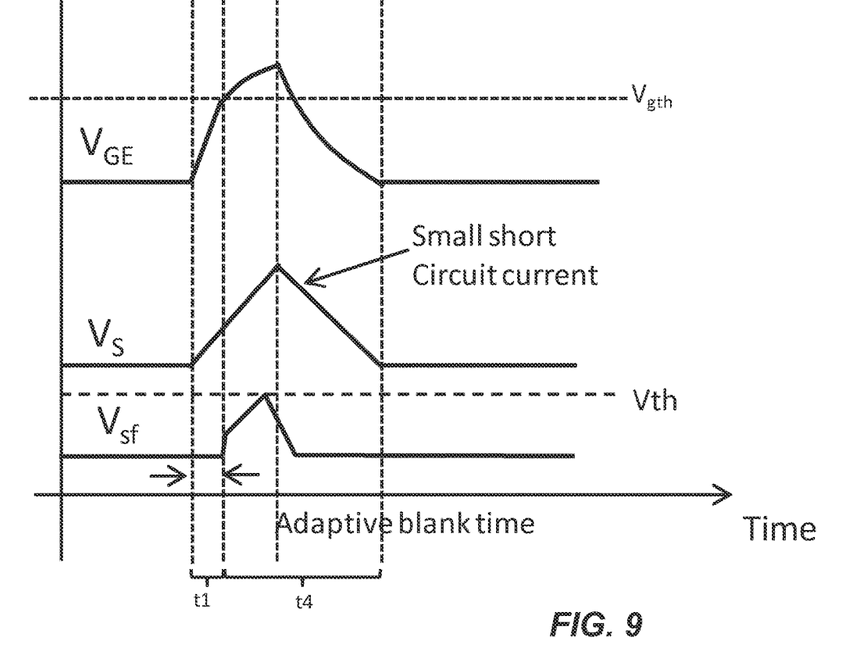
FIG. 9 is a timing diagram depicting current and voltage waveforms produced in the circuit of FIG. 7 during a short-circuit event.

With reference now to FIGS. 7-9, another illustrative circuit 700 used for the detection of and reaction to short-circuit events will be described in accordance with at least some embodiments of the present disclosure. The circuit 700 is similar to circuit 400 in that circuit 700 comprises an adaptive blanking circuit 404 and short-circuit detector 408. The adaptive blanking circuit 404 behaves in a similar manner to the adaptive blanking circuit 404 of FIG. 4 and is used to enforce an adaptive blanking time equal to a duration of the IGBT Q1 turn on time t1 and Miller Plateau duration t2. Moreover, the components of the adaptive blanking circuit 404 in circuit 700 are similar or identical to the components of the adaptive blanking circuit 404 in circuit 400.

The short-circuit detector 408, on the other hand, exhibits a slightly different behavior from the short-circuit detector 408 of circuit 400. The short-circuit detector 408 is still blinded to short-circuit events during the adaptive blanking period enforced by the adaptive blanking circuit 404, but rather than measuring the desaturation voltage of the IGBT Q1, the short-circuit detector 408 measures the emitter sense current Is flowing from the emitter of the IGBT Q1 to determine if a short-circuit event is occurring.

Specifically, the short-circuit detector 408 is provided with a sense resistor Rs and a filter resistor Rf that enable the second driver 420 to measure a sensing voltage Vsf that is proportional to the sense current Is. If the sensing voltage Vsf meets or exceeds a threshold voltage Vth, then the second driver 420 will determine that a short-circuit event is occurring and the first driver 204a can be shut down. The short-circuit detector 408 is blind to the sense current Is during the adaptive blanking period and then begins monitoring the sense current Is after the adaptive blanking period (e.g., during the detection time t4 or normal on time t3).

Use of the short-circuit detector 408 for measuring sense current Is is useful when the IGBT Q1 comprises a split emitter that outputs both an emitter current Ie and a sense current Is. The sense current Is is traditionally a fraction of the emitter current Ie (e.g., less than 10% of the emitter current Ie). Moreover, the sensing voltage is dependant upon the size of the sense resistor Rs, which can be in the range of 1 ohm to 200 ohms, depending upon the size of IGBT and threshold voltage Vth of second driver 420 used.

The circuits 400, 700 advantageously utilize an adaptive blanking circuit 404 to monitor the IGBT and provide an active feedback loop to the short-circuit detector 408. The feedback loop including the adaptive blanking circuit 404 and short-circuit detector 408 helps the short-circuit detector 408 know almost precisely when the IGBT has actually moved beyond its Miller Plateau 504 and the false detection of short-circuit events is minimized but the actual and quick detection of short-circuit events is important for protecting the IGBT from unnecessary damage.

While the illustrative circuits 400, 700 only depict a single short-circuit detector 408 and adaptive blanking circuit 404, it should be appreciated that multiple short-circuit detectors and adaptive blanking circuits can be incorporated into a circuit 400, 700 without departing from the scope of the present disclosure. For instance, a second short-circuit detector 408 and adaptive blanking circuit 404 may be implemented to protect a second IGBT Q2. Moreover, the circuit 400, 700 may comprise more than two IGBTs to drive a load 112, in which case each of the additional IGBTs may, or may not, have a short-circuit detector and/or adaptive blanking circuit 404 provided therefor.

Figure 10:
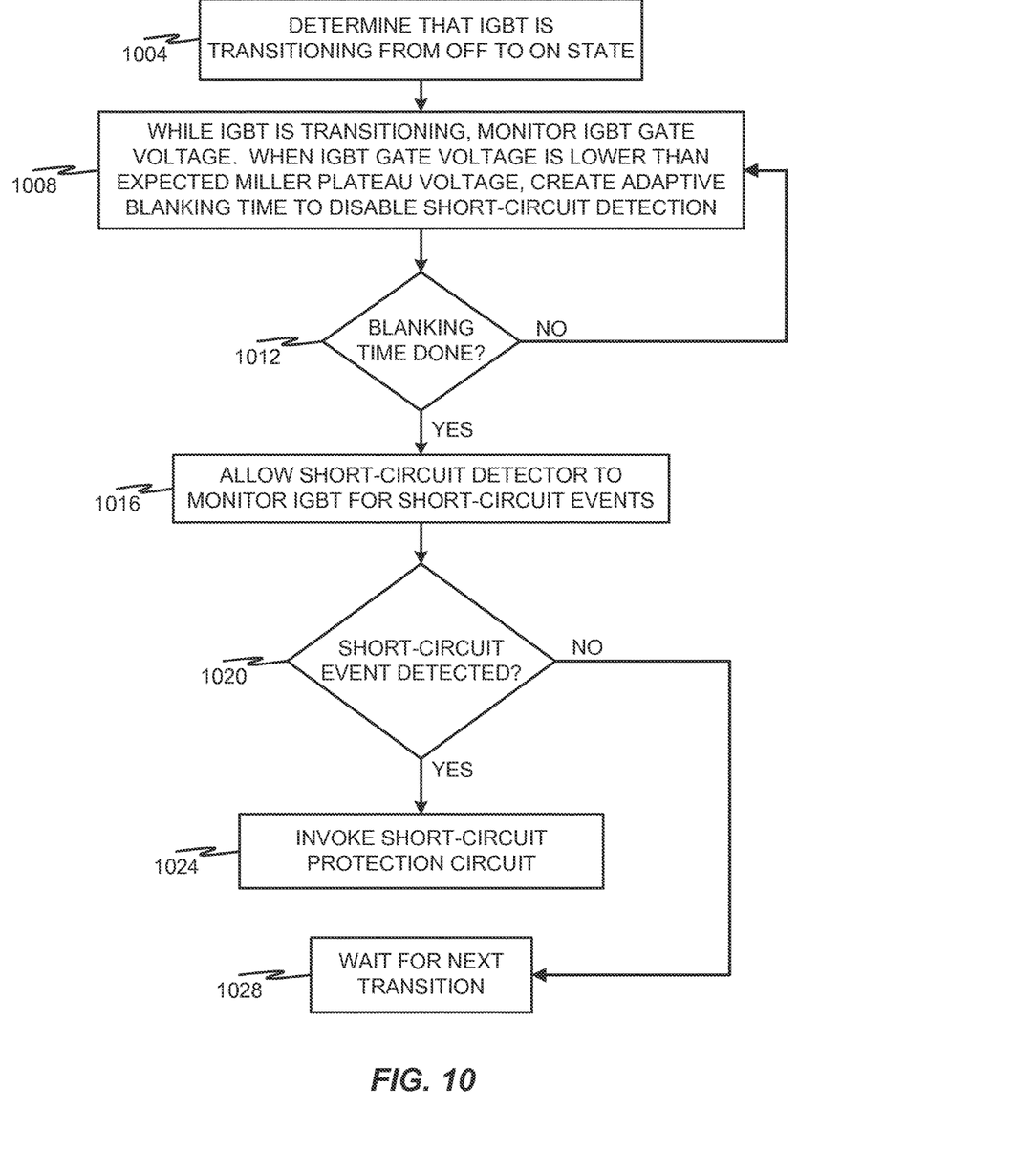
FIG. 10 is a flow diagram depicting a method of detecting and responding to a short-circuit event in accordance with at least some embodiments of the present disclosure.

With reference now to FIG. 10, an illustrative method 1000 for detecting and responding to short-circuit events in a circuit 400, 700 having one or more IGBTs will be described in accordance with at least some embodiments of the present disclosure. The method 1000 begins by determining that an IGBT is transitioning from an off state to an on state (step 1004). During this transition, an adaptive blanking circuit 404 in a short-circuit detection circuit 400, 700 is used to create an adaptive blanking time (step 1008). The adaptive blanking time is depending upon the actual duration of the transition time for the IGBT and the amount of time required for the IGBT to move through the Miller Plateau 504. Advantageously, the adaptive blanking time may vary from cycle to cycle and is not static based on a worst case scenario for the IGBT.

While waiting for the adaptive blanking time to complete (step 1012), the adaptive blanking circuit 404 will continue monitoring the gate-to-emitter voltage of the IGBT. Once the IGBT has moved beyond its Miller Plateau 504, the adaptive blanking circuit 404 activates a short-circuit detector 408, thereby allowing the short-circuit detector to monitor the IGBT for short-circuit events (steps 1016, 1020). Prior to being activated by the adaptive blanking circuit 404, however, the short-circuit detector 408 is blind to short-circuit events. In some embodiments, the short-circuit detector 408 comprises one or multiple components that enable the short-circuit detector to measure a desaturation voltage (e.g., collector-to-emitter voltage) of the IGBT and compare the desaturation voltage to a desaturation threshold voltage Vdesat_th to determine if a short-circuit event is occurring. In some embodiments, the short-circuit detector 408 comprises one or multiple components that enable the short-circuit detector to measure a sense current Is of the IGBT (or a sense voltage Vs proportionate to the sense current Is) to determine if a short-circuit event is occurring.

If no short-circuit event is detected, then the IGBT is allowed to operate normally (e.g., FIGS. 5 and 8) and the method 1000 will wait for the next transition of the IGBT from an off state to an on state (step 1028). Conversely, if the short-circuit detector 408 detects a short-circuit event, then a short-circuit protection circuit may be employed to protect the IGBT from unnecessary damage (step 1024). In some embodiments, the short-circuit protection circuit may simply turn off the first driver 204a, thereby stopping the flow of driving current to the IGBT. In some embodiments, a more sophisticated short-circuit protection circuit may be utilized. One non-limiting example of an improved short-circuit protection circuit is described in U.S. patent application Ser. No. 14/483,846, filed Sep. 11, 2014, and titled "SHORT-CIRCUIT PROTECTION CIRCUITS, SYSTEM, AND METHOD", the entire contents of which are hereby incorporated herein by reference.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:
at least one Insulated-Gate Bipolar Transistor (IGBT) having a gate, collector, and emitter;
a first driver for the at least one IGBT, the first driver configured to provide a driving current to the gate of the IGBT;
a load connected to the emitter of the at least one IGBT; and
a short-circuit detection circuit configured to create an adaptive blanking time during which a short-circuit detector for the IGBT is blind to short-circuit events for the IGBT, wherein the short-circuit detection circuit includes an active comparator circuit configured to compare a gate-to-emitter voltage with a gate threshold voltage and dynamically control the adaptive blanking time based on the comparison of the gate-to-emitter voltage with the gate threshold voltage.

2. The circuit of claim 1, further comprising:
an adaptive blanking circuit that enforces the adaptive blanking time.

3. The circuit of claim 1, wherein the active comparator circuit further comprises a switch that is selectively activated and deactivated based on whether or not the gate-to-emitter voltage has exceeded the gate threshold voltage.

4. The circuit of claim 3, wherein the short-circuit detector comprises a second driver that, when activated by the switch, is configured to compare a desaturation voltage of the IGBT with a desaturation threshold voltage.

5. The circuit of claim 4, wherein the second driver is activated by the switch when the switch has been informed that the gate-to-emitter voltage has exceeded the gate threshold voltage.

6. The circuit of claim 5, wherein the second driver is configured to shut down the first driver when the second driver is activated and has determined that the desaturation voltage of the IGBT has exceeded the desaturation threshold voltage.

7. The circuit of claim 3, wherein the short-circuit detector comprises a second driver that, when activated by the switch, is configured to measure an IGBT sense current in connection with determining if a short-circuit event is occurring for the IGBT.

8. The circuit of claim 7, wherein the emitter of the IGBT corresponds to a split emitter with the IGBT sense current being provided to the second driver and with emitter current being provided to the load.

9. The circuit of claim 3, wherein the switch comprises a (Metal-Oxide-Semiconductor Field-Effect Transistor) MOSFET that is normally switched on to cause the short-circuit detector to be non-operational and is switched off to cause the short-circuit detector to be operational.

10. The circuit of claim 1, wherein the adaptive blanking time corresponds to an amount of time that depends on a gate-to-emitter voltage of the IGBT exceeding a Miller Plateau level of the IGBT when the IGBT is switching from an off state to an on state.

11. The circuit of claim 10, wherein the short-circuit detector comprises a desaturation voltage-sensing circuit that is released to track a collector-to-emitter desaturation voltage when the gate-to-emitter voltage of the IGBT exceeds the Miller Plateau level of the IGBT.

12. The circuit of claim 10, wherein the short-circuit detector comprises an emitter sense circuit that is released to track a sense current provided by the emitter of the IGBT when the gate-to-emitter voltage of the IGBT exceeds the Miller Plateau level of the IGBT.

13. An Insulated-Gate Bipolar Transistor (IGBT) short-circuit detection circuit configured to detect short circuit event for an IGBT, wherein the IGBT is driven by a driver and, in response to signals received from the driver, drives a load, and wherein the IGBT comprises a gate, collector, and emitter, the short-circuit detection circuit comprising:
an active feedback loop driven by a comparator that compares a gate-to-emitter voltage of the IGBT to a gate threshold voltage and based on the comparison of the gate-to-emitter voltage of the IGBT to the gate threshold voltage creates an adaptive blanking time during which a short-circuit detector is blind to short-circuit events for the IGBT.

14. The short-circuit detection circuit of claim 13, wherein the active feedback loop further comprises a switch that is selectively activated and deactivated based on whether or not the gate-to-emitter voltage has exceeded the gate threshold voltage.

15. The short-circuit detection circuit of claim 14, wherein the short-circuit detector comprises a second driver that, when activated by the switch, is configured to compare a desaturation voltage of the IGBT with a desaturation threshold voltage.

16. The short-circuit detection circuit of claim 14, wherein the short-circuit detector comprises a second driver that, when activated by the switch, is configured to measure an IGBT sense current in connection with determining if a short-circuit event is occurring for the IGBT.

17. The short-circuit detection circuit of claim 14, wherein the switch comprises a transistor that is normally switched on to cause the short-circuit detector to be non-operational and is switched off to cause the short-circuit detector to be operational.

18. The short-circuit detection circuit of claim 13, wherein the adaptive blanking time corresponds to an amount of time that depends on the gate-to-emitter voltage of the IGBT exceeding a Miller Plateau level of the IGBT when the IGBT is switching from an off state to an on state.

19. A method of operating a short-circuit detection circuit, the method comprising:
determining that an Insulated-Gate Bipolar Transistor (IGBT) is transitioning from an off state to an on state, wherein the IGBT comprises a gate, collector, and emitter;
while the IGBT is transitioning from the off state to the on state, using an adaptive blanking circuit to create an adaptive blanking time during which a short-circuit detector is blind to short-circuit events for the IGBT; and
after the adaptive blanking time is done, allowing the short-circuit detector to monitor the IGBT for short-circuit events, wherein the short-circuit detector comprises a comparator that monitors at least one of gate-to-emitter voltage of the IGBT and an IGBT sense current.

20. The method of claim 19, wherein the adaptive blanking time is based on an amount of time that depends on a gate-to-emitter voltage of the IGBT exceeding a Miller Plateau level of the IGBT when the IGBT is switching from the off state to the on state.

* * * * *